United States Patent
van Voorst Vader et al.

(10) Patent No.: US 7,461,948 B2
(45) Date of Patent: Dec. 9, 2008

(54) MULTIPLE LIGHT EMITTING DIODES WITH DIFFERENT SECONDARY OPTICS

(75) Inventors: Pieter J. Q. van Voorst Vader, Son (NL); Pascal J. H. Bloemen, Eindhoven (NL); Nicola B. Pfeffer, Eindhoven (DE)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 172 days.

(21) Appl. No.: 11/260,713

(22) Filed: Oct. 25, 2005

(65) Prior Publication Data

US 2007/0091602 A1 Apr. 26, 2007

(51) Int. Cl.
*F21V 5/00* (2006.01)
(52) U.S. Cl. ............ 362/244; 362/242; 362/235
(58) Field of Classification Search ............ 362/244, 362/242, 235, 234, 11, 16, 237, 84; 359/652
See application file for complete search history.

(56) References Cited

U.S. PATENT DOCUMENTS

| | | | |
|---|---|---|---|
| 5,896,093 A * | 4/1999 | Sjoborn ............ 340/815.75 |
| 6,547,249 B2 | 4/2003 | Collins, III et al. ............ 277/88 |
| 6,885,035 B2 | 4/2005 | Bhat et al. ............ 257/99 |
| 7,207,691 B2 * | 4/2007 | Lee et al. ............ 362/231 |
| 2003/0053310 A1 * | 3/2003 | Sommers ............ 362/231 |
| 2003/0112523 A1 * | 6/2003 | Daniell ............ 359/626 |
| 2004/0072589 A1 * | 4/2004 | Hamamura et al. ...... 455/550.1 |
| 2005/0231948 A1 * | 10/2005 | Pohlert et al. ............ 362/237 |
| 2006/0126326 A1 * | 6/2006 | Ng et al. ............ 362/231 |
| 2007/0030675 A1 * | 2/2007 | Oon et al. ............ 362/237 |

* cited by examiner

*Primary Examiner*—Ali Alavi
*Assistant Examiner*—Evan Dzierzynski

(57) ABSTRACT

A plurality of light emitting diode dies (LED) with associated secondary optics, which produce different light distribution patterns, are combined to produce an efficient light source having a desired illumination pattern. By way of example, a first LED may include a lens that produces a light distribution pattern with a maximum intensity at the center while a second LED may use a lens that produces a light distribution pattern with a maximum intensity that surrounds the maximum intensity of the pattern produced by the first LED. The light from the LEDs can then be combined to produce a desired illumination pattern. Additional LEDs and lenses, e.g., having different light distribution patterns may be used if desired. Moreover, a variable current driver may be used to vary the amount of current to the different LEDs, such that the combined illumination pattern may be varied as desired.

26 Claims, 4 Drawing Sheets

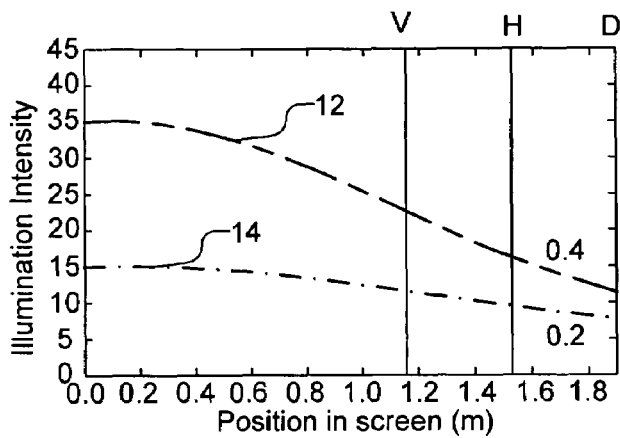
**Fig. 1
(Conventional)**

MULTIPLE LIGHT EMITTING DIODES WITH DIFFERENT SECONDARY OPTICS

FIELD OF THE INVENTION

The present invention relates to light emitting diode devices in general and, in particular, to a device with multiple light emitting diodes with different secondary optics to produce a desired illumination profile.

BACKGROUND

Light emitting diode (LED) devices have ever increasing applications. Devices that are capable of generating white light (consisting of R, G, and B components) are particularly interesting because of their potential for replacing conventional light sources, such as light bulbs.

However, some applications have space and illumination considerations that are difficult to overcome even with an LED's relatively small size. For example, some applications, such as flashes for small cameras, e.g., in mobile phones, spot lights, or flash lights, require a large amount of light on target, and yet little room is available for the device. Such applications are particularly problematic because the light distribution from the flash has to fulfill a number of specifications. For example, with a camera flash, it is generally desirable to increase its efficiency so that the illumination intensity in the center of the field of view of the camera to be slightly greater than that towards the edges of the field of view of the camera. Typically, at the horizontal edge of the field of view, the illumination intensity level should be around 60% of the center value, whereas at the corners a value around 30% is acceptable. To increase the illumination intensity level and modify the distribution, secondary optics, i.e., optics between the LED and the scene, are generally used. Without secondary optics, only a fraction, e.g., 20%, of the light emanating from the LED would reach the field of view area, whereas where conventional secondary optics are used approximately 40% of the light reaches the scene. With a conventional flash module, the value of 40% cannot be increased much. If one tries to increase the value, e.g., through collimating the light, other specifications are adversely affected. For example, if one designs secondary optics to increase the fraction of light to values significantly above 40%, the illumination intensity at the edges will decrease causing dark corners in the picture.

Additional problems are encountered with applications that have variable focal ranges. For example, it is desirable for a multi-focus cameras, commonly referred to as zoom lens cameras, to use a variable illumination profile to accommodate the different focal ranges. The use of lighting device with an illumination profile that is optimized for a fixed distance is inefficient in such applications. While the use of mechanical solution are possible, such as the increase or decrease in the source/optic distance, such solutions, however, are difficult to implement and are expensive. Moreover, the inclusion of an electro-mechanical device will require additional space, thereby limiting the space saving advantages of LED devices.

SUMMARY

In accordance with an embodiment of the present invention, a plurality of light emitting diode dies (LED) with associated second optics, which produce different light distribution patterns, are combined to produce a combined illumination having a desired pattern. In one embodiment, a first LED may include a lens that produces a light distribution pattern with a maximum intensity at the center while a second LED may use a lens that produces a light distribution pattern with a maximum intensity that surrounds the maximum intensity of the light distribution pattern produced by the first LED. Additional LEDs and lenses, e.g., having different light distribution patterns may be used if desired. The desired illumination pattern can be produced by combining the light from the LEDs. In one embodiment, a variable current driver may be used to vary the amount of current to one or more of the LEDs, such that the combined illumination pattern can be varied as desired.

BRIEF DESCRIPTION OF THE DRAWINGS

FIG. 1 is a graph illustrating the illumination intensity of conventional flash modules using three identical light emitting diodes (LEDs) each using the same second optics and using three identical LEDs without secondary optics.

DETAILED DESCRIPTION

Figure 2:
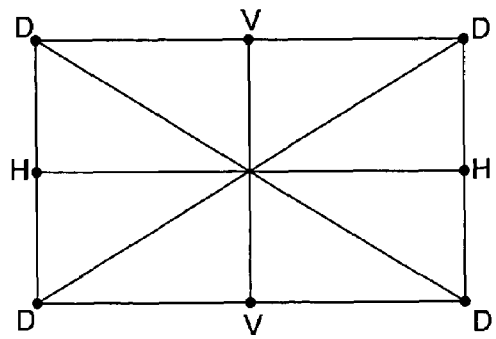
FIG. 2 graphically illustrates the field of view and identifies the vertical, horizontal and diagonal edges referenced in FIG. 1.

FIG. 1 is a graph illustrating the illumination intensity of conventional flash modules, where the horizontal axis denotes the distance with respect to the center of the scene (where symmetric optics are used), and the vertical axis denotes the illumination intensity. Conventionally, flash modules consist of a single LED with a single lens, multiple LEDs without secondary optics, or multiple LEDs each with individual, but the same secondary optics. FIG. 1 shows a first curve 12 illustrating the illumination intensity of three LEDs, each with identical lenses. The fraction of light reaching the scene is about 40%, and the light distributions specifications are met, i.e., the illumination intensity at the edge of the field of view is less than that at the center. In FIG. 1, the position indicated with "V" corresponds to the vertical field of view edge, "H" corresponds to the horizontal field of view edge, and "D" corresponds to the position at the diagonals on the field of view edge. FIG. 2, by way of example, graphically illustrates the field of view and identifies the vertical, horizontal and diagonal edges. FIG. 1 also shows a curve 14 that illustrates the illumination intensity of three LEDs without secondary optics and indicates that only about 20% of the light reaches the scene. With a conventional flash module, the value of 40% cannot be increased much without adversely affecting the other specifications, e.g., the illumination intensity at the edges the edges of the field of view.

Figure 3A:
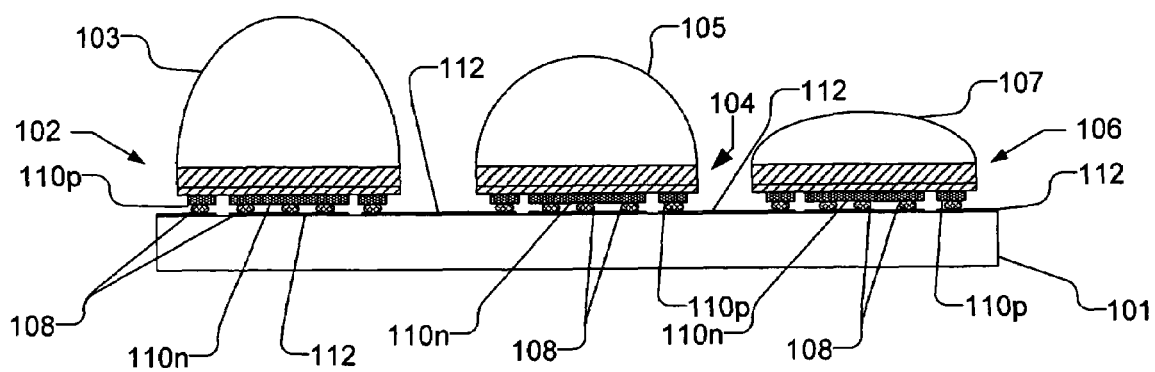
FIG. 3A shows a side view of a device that includes a plurality of LEDs with different secondary optics, each of which produces different light distribution patterns, in accordance with an embodiment of the present invention.

FIG. 3A shows a side view of a device 100 in accordance with an embodiment of the present invention. The device 100 includes a plurality of light emitting diode (LED) dies 102, 104, and 106, (sometimes referred to as LEDs 102, 104, and 106), each with a different type of secondary optic. Thus, a first type of lens 103 is mounted to the LED die 102, a second type of lens 105 is mounted to the LED die 104, and a third type of lens 107 is mounted to LED 106. The lenses 103, 105, and 107 are configured to produce different light distribution patterns from their respective LEDs 102, 104, and 106. The LEDs 102, 104, and 106 are mounted near each other on a submount 101, but are separated by a distance that is adequate to distinguish the optical centers of each LED die. While three LEDs 102, 104, and 106 are shown in FIG. 3A, it should be understood that fewer, e.g., two, or additional LEDs, e.g., four or more, may be used in accordance with an embodiment of the present invention. If desired, a plurality of submounts may be used, as indicated by dotted line 101a.

Figure 3B:
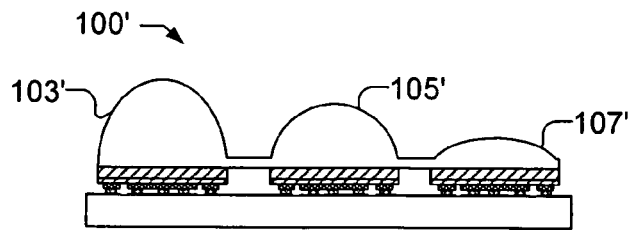
FIG. 3B shows a side view of a device similar to that shown in FIG. 3A where the optics are integrally formed.

The lenses 103, 105, and 107 shown in FIG. 3A maybe separately formed or alternatively, as illustrated in FIG. 3B, a device 100', which is similar to device 100 shown in FIG. 3A may use integrally formed lenses 103', 105', and 107', which may be formed, e.g., by injection molding, casting, and transfer molding or in another appropriate manner.

The LEDs 102, 104, and 106 and the submount 101 can be, e.g., the type discussed in U.S. Pat. No. 6,885,035 to Bhat et al., the entirety of which is incorporated herein by reference. As can be seen in FIG. 3A, the p and n contact pads 110p and 110n are on the same side of the LEDs 102, 104, and 106 in what is often referred to as a flip-chip or inverted design. The light generated by LEDs 102, 104, and 106 is coupled out of the LEDs on the side opposite to the contact pads. The LEDs 102, 104, and 106 may be, e.g., the III-nitride type, which has a composition that includes, but is not limited to GaN, AlGaN, AlN, GaInN, AlGaInN, InN, GaInAsN, and GaInPN. Typical substrate materials are sapphire, silicon carbide SiC, or III-nitrides, because of the ease of nucleating and growing high quality III-nitride crystals on these substrates. The LEDs 102, 104, and 106 or a bonding material (not shown) between the LEDs 102, 104, and 106 and the respective lenses 103, 105, and 107 may include a phosphor coating to produce a desired white light. For example, a blue pump LED die may be coated with a yellow phosphor to produce a mix of blue and yellow light that is seen as white.

The contact pads 110n and 110p are electrically connected to metal traces 112 on or in the submount 101, e.g., by gold stud bumps 114. Thus, because the LEDs 102, 104, and 106 have an inverted design, the electrical contacts formed by, e.g., the stud bumps 108 are between the submount 101 and the bottom surface of the LEDs 102, 104, and 106. The interconnection between the stud bumps 108 and the metal traces 112 on the submount 101 make electrical connection between the LED and the submount while providing a thermal path for heat removal from the LED during operation. Although the illustrated embodiments refer to gold stud bumps, the interconnects may be made of elemental metals, metal alloys, semiconductor-metal alloys, solders, thermally and electrically conductive pastes or compounds (e.g., epoxies), eutectic joints (e.g., Pd—In—Pd) between dissimilar metals between the LED die and submount, or solder bumps.

The submount 101 may be formed from Si or ceramic, such as high-temperature cofired ceramic, or other appropriate materials, such as thin film alumina or other thermal packaging material. An optional dielectric layer, e.g. $SiO_2$, (not shown) may be included on the submount for electrical isolation between the LED die and the submount substrate. Additional devices may be mounted on the submount 101 or within the circuitry 112 on the submount 101, if desired. For example, an Electro-static Discharge (ESD) protection circuit may be mounted on the submount 101.

Figure 4:
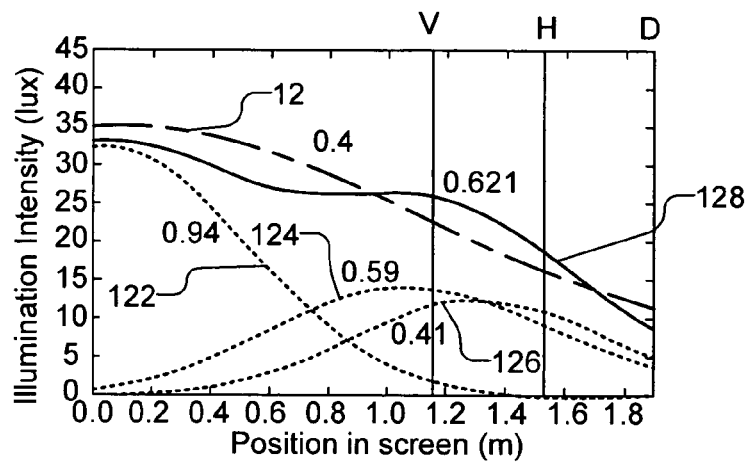
FIG. 4 is a graph illustrating the illumination intensity of a device with a three LEDs having different types of secondary optics, such as that shown in FIG. 3A.

FIG. 4 is a graph, similar to the graph of FIG. 1, and illustrating the illumination intensity of a device with a three LEDs having different types of secondary optics, such as that shown in FIG. 3. FIG. 4 illustrates the illumination intensity of the individual LEDs with dotted curves and the summation of the illumination intensity with a solid curve. The illumination intensity of a conventional device is illustrated with dashed line 12 for sake of comparison.

As illustrated by curve 122 in FIG. 4, one LED includes optics that produce illumination with a maximum in the center and has a relatively high degree of collimation, e.g., 94% of the light emitted from the first LED reaches the scene. As illustrated by curves 124 and 126, the optics associated with the other two LEDS produce illumination patterns with maximum intensities that surround the maximum intensity of the light distribution pattern produced by the first LED, e.g., curve 122. The illumination patterns produced by second and third LEDs, illustrated by curves 124 and 126 may have an ring, square, elliptical or other appropriate shape. The distribution pattern produced by the third LED, illustrated by curve 126 has a maximum intensity that also at least partially surrounds the distribution pattern produced by the second LED, illustrated by curve 124. Moreover, the distribution patterns illustrated by curves 124 and 126 also have a high degree of collimation, e.g., 59% and 41% of the light emitted from the other two LEDs, respectively, reaches the scene. The summation of the illumination intensity of the three LEDs is illustrated by curve 128. Because of the high degree of collimation of the light emitted from the LEDs, a greater amount of light, e.g., approximately 62%, reaches the scene than in a conventional system, which is approximately 40%.

One important advantage of employing LEDs having different optics that produce collimated light, as illustrated in FIGS. 3A, 3B, and 4, is that less current is necessary to achieve the same illumination level as a conventional system or, alternatively, greater illumination levels can be achieved using the same current as conventional systems. In the present example, the illumination distribution obtained using a conventional system with three identical lenses, illustrated by curve 12, is obtained by operating all three LEDs at the maximum current. On the other hand, the first LED can produce the illumination intensity illustrated by curve 122 while operating at only 46% of the maximum current while the other two LEDs can produce the illumination intensity illustrated by curves 124 and 126 while operating at 70% of the maximum current. As can be seen in FIG. 4, despite operating the LEDs with reduced current, the total resulting illumination intensity, illustrated by curve 128, is approximately the same as that produced by a conventional system, illustrated by curve 12, which operates at maximum current. Accordingly, when compared in terms of the average number of Lux within the field of view per Watt power, this means that with the present invention, illustrated in FIG. 4, is a factor of 1.5 more efficient than the conventional system. Thus, battery power may be conserved with the use of an embodiment of the present invention.

In another embodiment of the present invention, the LEDs 102, 104, and 106 may be individually addressed with a variable driver current to control the intensity of the light produced. In this manner, different light distribution patterns may be produced as desired.

In one embodiment, the LEDs are connected to a main current driver and are separately controlled using a separate current regulator and on/off switch for each LED. Alternatively, the variable driver circuit includes a plurality of separate adjustable current drivers. Each separate adjustable current driver is connected to and controls one or more LEDs. In general, designing a variable current driver circuit that independently controls the current through a plurality of LEDs to adjust the illumination intensity produced by the individual LEDs is well within the abilities of those of ordinary skill in the art in light of the present disclosure.

Figure 5:
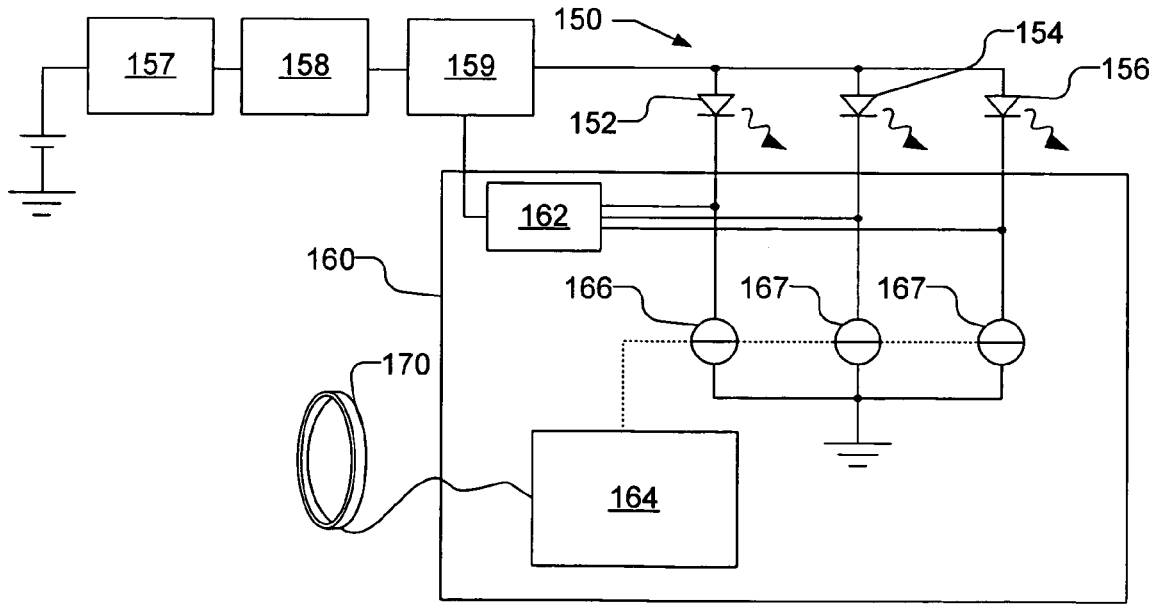
FIG. 5 illustrates a schematic of a device with multiple LED dies, each with different secondary optics, that are controlled with variable driver current elements.

FIG. 5 illustrates a schematic of one embodiment of a device 150 with a variable cuTent driver circuit 160 connected to LED dice 152, 154, and 156. Device 150 may be similar to the device 100, shown in FIG. 3A, with the addition of independently controlling each LED with the variable cuffent driver circuit 160. As illustrated in FIG. 5, the device 150 includes a current limiter and charger 157, an energy storage circuit 158, such as a battery, capacitor, or supercapacitor, and a boost voltage driver 159. The boost voltage driver 159 is coupled to the anode and cathode of the LED dies 152, 154, and 156 through circuit 162 in the variable cuffent driver circuit 160 to ensure that the proper forward voltage is provided. A control circuit 164 illustrated as part of the variable cuffent driver circuit 160 is connected to and independently controls the current through LEDs 152, 154, and 156, respectively, via control elements 166, 167, and 168, respectively. The control circuit 164 may be, e.g., a controller set in the CPU of the mobile phone (or other application) itself. Control elements 166, 167, 168 may be, e.g., a FET with an op amp and a reference resistor that enables active cuTent controlling, but of course, other circuits may be used if desired. Circuit elements that vary, or control, the amount of cuffent that flows through a circuit are well known. For example, electronic switches or a programmable driver, e.g., 12C interface, may be used. The control circuit 164 may detect the state of another element, such as an adjustable lens 170 in a camera, and in response provides the appropriate signals to the control elements 166, 167, and 168 to adjust the amount of current flowing through the LEDs.

It should be understood that while each LED 152, 154, and 156 is shown as being independently controlled by a separate control element 166, 167, and 168, respectively, more than one LED may be controlled by each variable driver current element. For example, LEDs 154 and 156 may be controlled by the same control element. Alternatively, multiple LEDs may be controlled by each control element, e.g., a number of LEDs that produces the same or similar light distribution patterns may be controlled by the same control element.

FIGS. 6 through 10 illustrate the operation of a device with multiple LED dies, each having a different type of lens and being independently controlled with a variable driver current element. For the sake of simplicity, however, FIGS. 6 through 10 illustrate the operation of a device that has two LEDs, e.g., LEDs 152 and 154, as opposed to the three LEDs shown in FIG. 5. The operation of a device with three or more LEDs, in accordance with an embodiment of the present invention, will be clear to one of ordinary skill in the art in light of the present disclosure.

Figure 6:
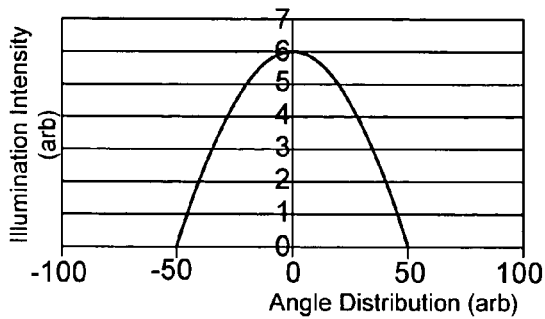
FIGS. 6 and 7 illustrate the illumination intensity of the light distribution patterns of two of LEDs.
Figure 7:
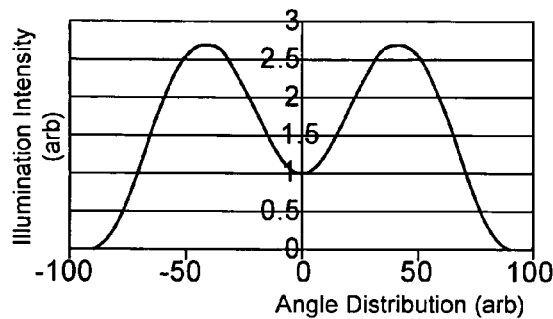

FIGS. 6 and 7 illustrate the illumination intensity of LED 152 and LED 154, respectively, in arbitrary units with respect to the angle of distribution. As can be seen in FIGS. 6 and 7, the lens on LED 152 generates an illumination pattern with a relatively strong peak on center, but that falls off steeply at the edges, while the lens on LED 154 generates an illumination pattern that is ring shaped, sometimes referred to as a batwing light distribution pattern.

Figure 8:
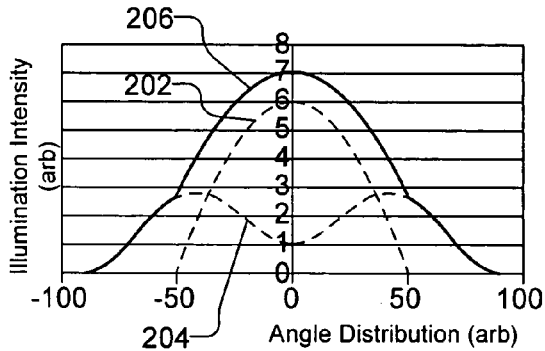
FIG. 8 illustrates a combined illumination pattern with a strong center peak.

By combining the illumination patterns from LED 152 and LED 154 and varying the illumination intensity of the LEDs 152 and 154, e.g., by varying the current via variable current driver elements 162 and 164, different illumination patterns may be produced. For example, as shown in FIG. 8, by providing more current to LED 152 than to LED 154, illustrated as curves 202 and 204, respectively, a combined illumination pattern with a strong center peak and a relatively small field of illumination is produced, illustrated as curve 206. This illumination pattern may be particularly advantageous when it is desired to illuminate an object that is at a relatively large distance, such as when a camera flash is desired with a telephoto lens. In one embodiment, no current is provided to LED 154 and all available battery current is provided to LED 152 to produce illumination with only the strong center peak.

Figure 9:
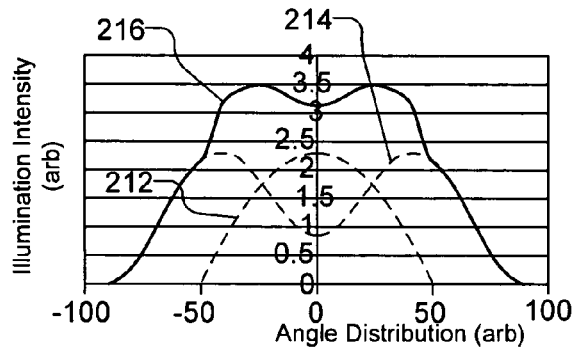
FIG. 9 illustrates a combined illumination pattern with an approximately uniform light distribution.

Alternatively, by providing approximately the same current to LED 152 and LED 154, as illustrated by respective curves 212 and 214 in FIG. 9, a relatively balanced illumination pattern is produced, illustrated as curve 216. This illumination pattern may be particularly useful when using a flash under a "normal" lens condition, i.e., neither telephoto nor wide angle is used.

Figure 10:
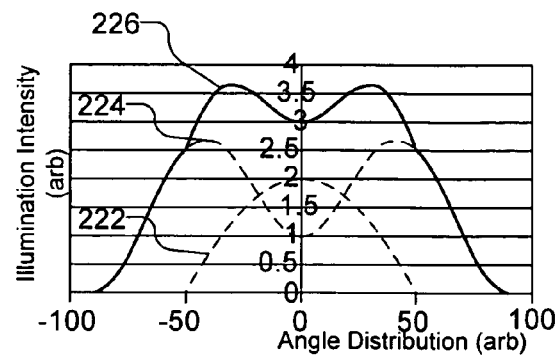
FIG. 10 illustrates a combined illumination pattern with a wide light distribution.

In another configuration, less current is provided to LED 152 than to LED 154, as illustrated by curves 222 and 224, respectively, in FIG. 10. The resulting illumination pattern, illustrated as curve 226 has a wide light distribution pattern. This illumination pattern may be particularly advantageous for, e.g., wide angle or macro performance.

Of course, other combined illumination patterns are possible. For example, an approximately flat distribution pattern may be possible, i.e., where the same illumination intensity is provided across the field of view. Moreover, if desired, only one of the LEDs, e.g., the LED 152 that produces the strong center peak illumination, may be used to provide to provide a focused beam, e.g., for use as a flashlight or spot light. Other optimizations are possible depending on desired application of the present invention, e.g., cell phone flash, running lights or map lights in an automobile, or a camcorder illumination system.

Figure 11:
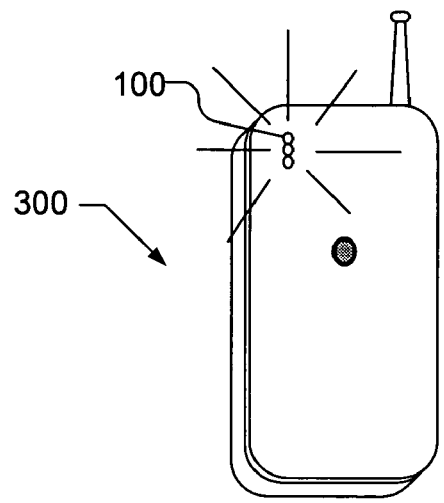
FIG. 11 illustrates a cell phone body with which the present invention may be used.

Moreover, it should be understood that the method of attaching the various lenses with the LEDs may vary. For example, in one embodiment, the lenses 103, 105, and 107 of device 100 maybe mounted, bonded, or appropriately connected directly to the underlying LEDs, which may then be installed within the structure of the final application, e.g., the cell phone body 300 show in FIG. 11. Alternatively, the lenses 103, 105, and 107 may be mounted to, bonded, or otherwise formed in the structure of the final application, e.g., in the cell phone body 300, and the LEDs may then be attached to the structure, e.g., using a bonding material or by snap fitting.

Figure 12A:
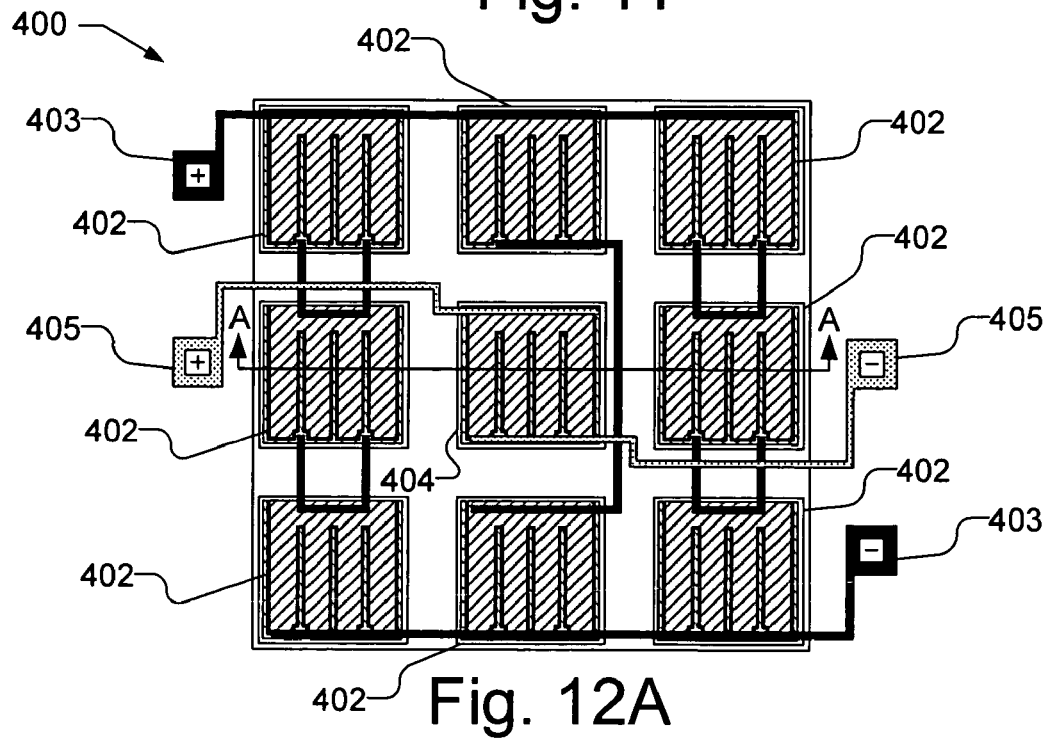
FIG. 12A illustrates a monolithic device with an array of light emitting diode devices formed which is used in accordance with the present invention.

While the present invention is described generally as separate LED devices mounted on a submount, it should be a single monolithic device may be used with the present invention. FIG. 12A, by way of example, illustrates a monolithic device 400 with an array of light emitting diode devices formed thereon. Device 400 shows a total of nine light emitting diode device, but more or fewer devices may be used if desired. As illustrated in FIG. 12A, the light emitting diode devices 402 along the perimeter of the array are coupled together, e.g., in series/parallel and driven by contacts 403. If desired, all the light emitting diode devices 402 may be coupled in series. The center light emitting diode device 404 is separately driven by contacts 405. Thus, the current to the center device 404 may be independently controlled from the current to the remaining devices 402. Producing a suitable monolithic device is described in more detail in U.S. Pat. No. 6,547,249, which is incorporated herein by reference.

Figure 12B:
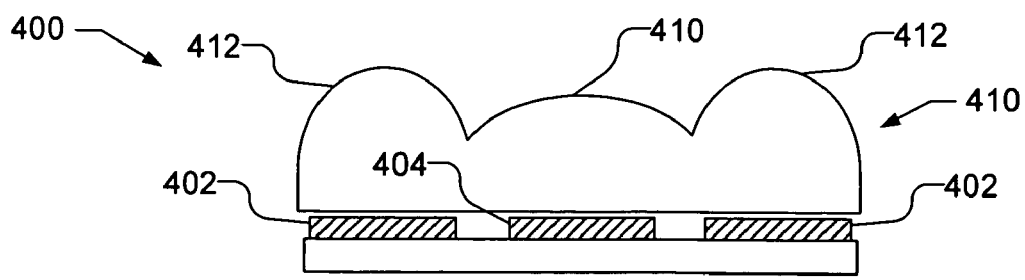
FIG. 12B illustrates a simplified cross-sectional view of the monolithic device of FIG. 12A along line A-A with the additional of an optical element.

FIG. 12B illustrates a simplified cross-sectional view of the device 400 along line A-A in FIG. 12A, with the additional of an optical element 410. As illustrated in FIG. 12B, the optical element 410 may include separate lens elements 412 and 414 for the different light emitting diode devices 402 and 404, respectively. In one embodiment, a single lens element may be used for all of the light emitting diode devices 402 and 404, in which case, the illumination intensity is controlled only by the variable currents to the different light emitting diode devices in the array.

Although the present invention is illustrated in connection with specific embodiments for instructional purposes, the present invention is not limited thereto. Various adaptations and modifications may be made without departing from the scope of the invention. Moreover, while the present invention is primarily described as being used as flash for a compact camera, the present invention may be used in other applications, such as a flash for other types of cameras, or as a steady light source in applications including to but not limited to a flashlight, or spotlight. Therefore, the spirit and scope of the appended claims should not be limited to the foregoing description.

What is claimed is:

1. An apparatus comprising:
   at least one submount;
   a first light emitting diode die and a second light emitting diode die mounted on the at least one submount;
   a first type of lens optically coupled to the first light emitting diode die and a second type of lens optically coupled to the second light emitting diode die, wherein the first type of lens produces a light distribution pattern with greater intensity peak on center than is produced by the second type of lens;
   a variable driver current circuit electrically coupled to at least one of the first light emitting diode die and the second light emitting diode die, the variable driver current circuit providing a current that can be varied to vary the illumination intensity of the at least one of the first light emitting diode die and the second light emitting diode die to which the variable driver current circuit is electrically coupled; and
   an adjustable lens, wherein the variable driver current circuit is coupled to the adjustable lens and varies the current to at least one of the first light emitting diode die and the second light emitting diode die in response to the state of the adjustable lens.

2. The apparatus of claim 1, wherein the first type of lens produces a first light distribution pattern with a maximum illumination intensity in the center and that is approximately collimated and the second type of lens produces a second light distribution pattern with a maximum illumination intensity that surrounds the maximum illumination intensity of the first light distribution pattern.

3. The apparatus of claim 1, wherein the second type of lens produces a light distribution pattern with greater angle of distribution than is produced by the first type of lens.

4. The apparatus of claim 1, wherein the first type of lens and the second type of lens are integrally formed.

5. The apparatus of claim 1, further comprising a third light emitting diode die mounted on the at least one submount and a third type of lens optically coupled to the third light emitting diode die, wherein the first type of lens produces a light distribution pattern with greater intensity peak on center than is produced by the third type of lens.

6. The apparatus of claim 1, further comprising a plurality of additional light emitting diode dice mounted on the at least one submount and one or more of types of lenses coupled to the plurality of additional light emitting diode dice, wherein the first type of lens produces a light distribution pattern with greater intensity peak on center than is produced by the one or more of types of lenses coupled to the plurality of additional light emitting diode dice.

7. The apparatus of claim 1 wherein the variable driver current circuit provides a first variable current to the first light emitting diode die to vary the illumination intensity of the light produced by the first light emitting diode die and a second variable current to the second light emitting diode die to vary the illumination intensity of the light produced by the second light emitting diode die.

8. The apparatus of claim 1 wherein the variable driver current circuit comprises a first variable driver current element that is electrically coupled to the first light emitting diode die and a second variable driver current element that is electrically coupled to the second light emitting diode die and a control circuit that is electrically coupled to the first variable driver current element and the second variable driver current element.

9. The apparatus of claim 1 wherein the variable driver current circuit provides a pulsed current to the at least one of the first light emitting diode die and the second light emitting diode die to produce a flash of illumination.

10. The apparatus of claim 1, wherein the submount comprises at least one metal trace formed on the surface of or within the at least one submount, wherein one of the plurality of light emitting diode dice is electrically connected to the metal trace.

11. The apparatus of claim 1, wherein at least one of the first light emitting diode die and the second light emitting diode die is an inverted type having all of a plurality of electrical contacts on a bottom surface wherein the plurality of electrical contacts are between the at least one submount and the bottom surface.

12. The apparatus of claim 1, further comprising a cell phone body, wherein the first type of lens and the second type of lens are coupled to the cell phone and wherein the submount, the first light emitting diode die and the second light emitting diode are coupled to the cell phone so that the first type of lens is optically coupled to the first light emitting diode die and the second type of lens is optically coupled to the second light emitting diode die.

13. A method comprising:
   producing light from a first light emitting diode die;
   generating a first light distribution pattern with a maximum intensity at the center using a first lens that is associated with the first light emitting diode die;
   producing light from a second light emitting diode die;
   generating a second light distribution pattern with a maximum intensity that surrounds the maximum intensity of the first light distribution pattern using a second lens that is associated with the second light emitting diode die;
   wherein the first light distribution pattern and the second light distribution pattern are combined to produce a combined light distribution pattern; and
   varying the current provided to at least one of the first light emitting diode die and the second light emitting diode die to vary the combined light distribution pattern, wherein varying the current is performed in response to the state of an adjustable lens in a camera.

14. The method of claim 13, further comprising: producing light from a third light emitting diode die;
generating a third light distribution pattern with a maximum intensity that at least partially surrounds the maximum intensity of the second light distribution pattern using a third lens that is associated with the third light emitting diode die;
wherein the third light distribution pattern is combined with the first light distribution pattern and the second light distribution pattern to produce the combined light distribution pattern.

15. The method of claim 13, wherein the first lens and the second lens are integrally formed.

16. The method of claim 13, wherein producing light from a first light emitting diode die and producing light from the second light emitting diode die is performed by providing less than the maximum cuffent to the first light emitting diode die and the second light emitting diode die.

17. The method of claim 13, wherein producing light from a first light emitting diode die and producing light from the second light emitting diode die produces a flash of illumination.

18. A method comprising:
providing at least one submount;
positioning and mounting a plurality of light emitting diode dice on the at least one submount;
providing a plurality of lenses, wherein each lens produces a different light distribution pattern; and
optically coupling the plurality of light emitting diode dice to the plurality of lenses so that each lens in the plurality of lenses is aligned with a corresponding light emitting diode die;
coupling a variable driver current circuit to the plurality of light emitting diode dice wherein at least one light emitting diode die is coupled to the variable driver current circuit to receive a variable cuffent; and
coupling a control circuit to the variable driver current circuit and to an adjustable lens, wherein the control circuit detects the state of the adjustable lens and in response provides a signal to the variable driver circuit to vary the current to at least one of the first light emitting diode die and the second light emitting diode die.

19. The method of claim 18, wherein at least a first light emitting diode die and a second light emitting diode die are coupled to the variable driver current circuit to receive different variable currents, wherein the variable driver current circuit provides different variable currents to vary the illumination intensity produced by the first light emitting diode die and the second light emitting diode die.

20. The method of claim 18, wherein the plurality of lenses are individually formed.

21. The method of claim 18, wherein the plurality of lenses are coupled to a structure, and wherein optically coupling the plurality of light emitting diode dice to the plurality of lenses comprises mounting the plurality of light emitting diode dice to the structure so that the plurality of light emitting diode dice are aligned with the plurality of lenses.

22. The method of claim 18, wherein a first light distribution pattern has a greater intensity peak on center than a second light distribution pattern.

23. A method comprising:
producing light from a first light emitting diode die;
generating a first light distribution pattern with a maximum intensity at the center using a lens that is associated with the first light emitting diode die;
producing light from at least one additional light emitting diode die; and
generating a second light distribution pattern with a maximum intensity that surrounds the maximum intensity of the first light distribution pattern using a lens that is associated with the at least one additional light emitting diode die;
wherein the first light distribution pattern and the second light distribution pattern are combined to produce a combined light distribution pattern; and
varying the current provided to at least one of the first light emitting diode die and the second light emitting diode die to vary the combined light distribution pattern, wherein varying the current is performed in response to the state of an adjustable lens in a camera.

24. The method of claim 23, wherein the same lens is associated with the first light emitting diode die and the at least one additional light emitting diode die.

25. The method of claim 23, wherein separate lenses are associated with the first light emitting diode die and the at least one additional light emitting diode die.

26. The method of claim 23, wherein producing light from a first light emitting diode die and producing light from at least one additional light emitting diode die is performed by providing less than the maximum current to the first light emitting diode die and the second light emitting diode die.

* * * * *